(12) United States Patent
Yokoyama et al.

(10) Patent No.: US 8,492,726 B2
(45) Date of Patent: Jul. 23, 2013

(54) RADIATION DETECTION APPARATUS AND RADIATION DETECTION SYSTEM

(75) Inventors: Keigo Yokoyama, Honjo (JP); Chiori Mochizuki, Sagamihara (JP); Minoru Watanabe, Honjo (JP); Jun Kawanabe, Kodama-gun (JP); Kentaro Fujiyoshi, Kumagaya (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/296,105

(22) Filed: Nov. 14, 2011

(65) Prior Publication Data

US 2012/0126126 A1  May 24, 2012

(30) Foreign Application Priority Data

Nov. 22, 2010 (JP) .................................. 2010-260524

(51) Int. Cl.
*G01T 1/20* (2006.01)

(52) U.S. Cl.
USPC ..................... 250/366; 250/369; 250/361 R

(58) Field of Classification Search
USPC ............ 250/366, 369, 361 R, 370.08, 370.11
See application file for complete search history.

(56) References Cited

U.S. PATENT DOCUMENTS

| 5,801,385 | A  | * | 9/1998 | Endo et al. | 250/370.11 |
| 2009/0050817 | A1 | * | 2/2009 | Horiuchi | 250/370.11 |
| 2009/0127466 | A1 | * | 5/2009 | Chiyoma | 250/361 R |
| 2011/0127440 | A1 | * | 6/2011 | Ohta et al. | 250/370.08 |

FOREIGN PATENT DOCUMENTS

| JP | 07-027864 A | 1/1995 |
| JP | 2003262675 A * | 9/2003 |

* cited by examiner

*Primary Examiner* — David Porta
*Assistant Examiner* — Faye Boosalis
(74) *Attorney, Agent, or Firm* — Canon U.S.A., Inc. IP Division

(57) ABSTRACT

A radiation detection apparatus includes a scintillator configured to convert incident radiation into visible light, a photoelectric conversion unit and an electrically conductive member. The photoelectric conversion unit includes a two-dimensional array of pixels arranged on a substrate. Each pixel is configured to convert the visible light into an electric signal. The electrically conductive member is supplied with a fixed potential. The electrically conductive member, the substrate, the photoelectric conversion unit, and the scintillator are disposed in this order from the radiation-incident side of the radiation detection apparatus to the opposite side.

11 Claims, 6 Drawing Sheets

RADIATION DETECTION APPARATUS AND RADIATION DETECTION SYSTEM

BACKGROUND OF THE INVENTION

1. Field of the Invention

The present invention relates to a radiation detection apparatus and a radiation detection system applicable to a medical imaging apparatus, a non-destructive testing apparatus, an analysis apparatus using radiation, or the like.

2. Description of the Related Art

In recent years, thin-film semiconductor production technology has been used in the fabrication a detection apparatus or a radiation detection apparatus realized by a combination of a switch element such as a TFT (Thin-Film Transistor) and a conversion element such as a photoelectric conversion element. Japanese Patent Laid-Open No. 07-027864 discloses a radiation detection apparatus in which a solid-state photodetector is disposed on a side on which X-ray radiation emitted by an X-ray source is incident, and a scintillator is disposed on an opposite side. That is, the scintillator is disposed on the side opposite to the radiation-incident side of the photodetector. One of the problems affecting this type of radiation detection apparatuses is that electromagnetic noise that originates from the X-ray source or generated within the radiation detection apparatus, together with the X-ray radiation, is incident on the photodetector.

SUMMARY OF THE INVENTION

In the radiation detection apparatus in which the scintillator is disposed on the side opposite to the radiation-incident side of the photodetector, the present invention provides a technique for reducing an influence of electromagnetic noise that is incident, together with primary radiation, on the photodetector.

In an aspect of the present invention, a radiation detection apparatus includes a scintillator configured to convert incident radiation into visible light, a photoelectric conversion unit including a two-dimensional array of pixels arranged on a substrate, each pixel configured to convert the visible light into an electric signal, and an electrically conductive member supplied with a fixed potential. The electrically conductive member, the substrate, the photoelectric conversion unit, and the scintillator are disposed in this order from a radiation-incident side of the radiation detection apparatus to an opposite side thereof.

Thus, in the radiation detection apparatus in which the scintillator is disposed on the side opposite to the radiation-incident side of the photodetector configured in the above-described manner, the influence of electromagnetic noise incident, together with primary radiation, on the radiation-incident side of the photodetector is effectively reduced.

Further features of the present invention will become apparent from the following description of exemplary embodiments with reference to the attached drawings.

DESCRIPTION OF THE EMBODIMENTS

The present invention is described in further detail below with reference to embodiments in conjunction with the accompanying drawings. In the present description, the term "radiation" is used to describe various kinds of radiations including particle beams such as an alpha ray, a beta ray, a gamma ray, etc., radiated via radioactive decay, and other beams with high energy similar to that of such particle beams. For example, an X-ray, a cosmic ray, etc., fall in the scope of radiation described in the present application.

First Embodiment

Figure 1A:
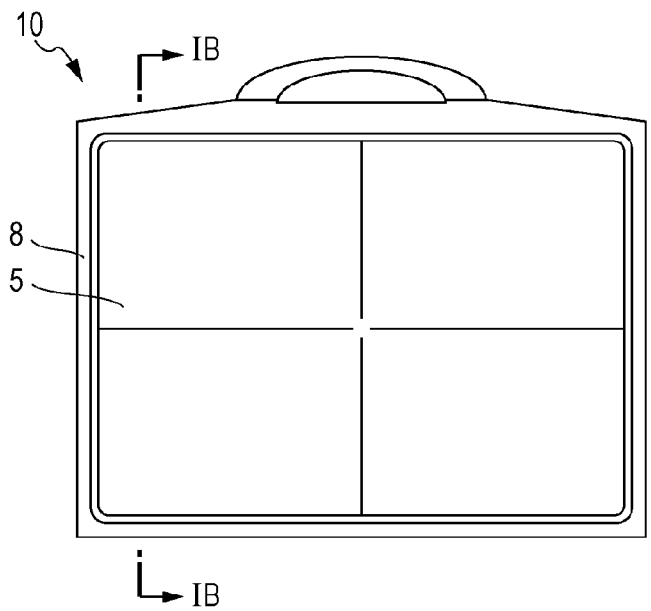
FIG. 1A is a top view of a radiation detection apparatus according to an embodiment of the present invention and FIGS. 1B and 1C are a cross-sectional view and a back view thereof.
Figure 1B:
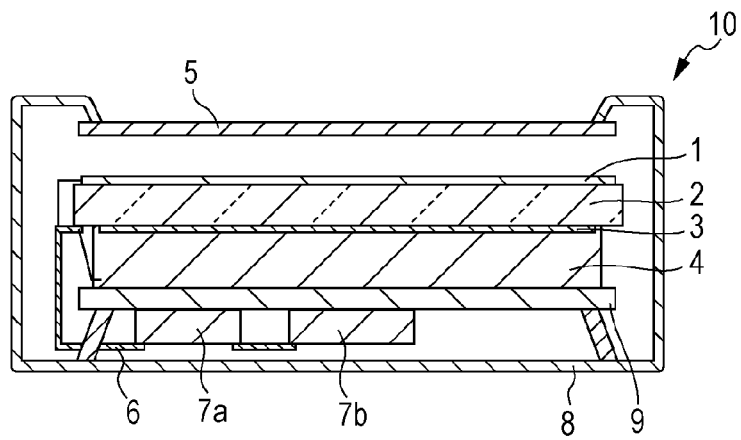
Figure 1C:
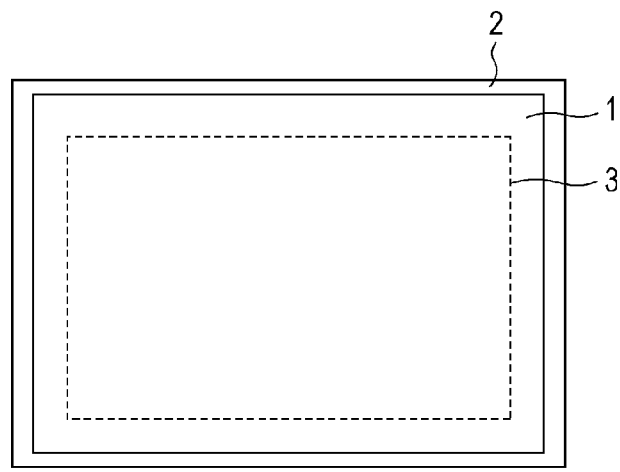

First, referring to FIG. 1A, FIG. 1B and FIG. 1C, a radiation detection apparatus 10 according to a first embodiment of the present invention is described below. FIG. 1A is a top view (front view), FIG. 1B is a cross-sectional view along sectional marks IB-IB of FIG. 1A, and FIG. 1C is a bottom view (back view) of the radiation detection apparatus 10.

As illustrated, the radiation detection apparatus 10 has a generally rectangular shape and is provided with a handle for maneuvering and positioning. A photoelectric conversion unit 3 is disposed on a side of a first surface of a substrate 2 such as a glass substrate with an insulating surface. The photoelectric conversion unit 3 includes a plurality of pixels arranged in a two-dimensional array. Each pixel includes a photoelectric conversion element and a switch element. Note that the substrate 2 and the photoelectric conversion unit 3 are placed such that radiation is incident on the substrate 2 from a second surface, opposing the first surface, of the substrate 2.

Hereinafter, for each element, a surface thereof on which radiation is incident will be referred to as a second surface, while a surface opposite to the second surface will be referred to as a first surface.

An end of the first surface of the substrate 2 is connected, via a flexible wiring board 6, to printed circuit boards 7a and 7b. Various integrated circuits are mounted on the flexible wiring board and the printed circuit boards.

The integrated circuits include, for example, a driving circuit for driving the photoelectric conversion unit 3, a reading circuit for reading the electric signal from the photoelectric conversion unit 3, a power supply circuit for supplying electric power to at least one of the driving circuit and the reading circuit, a control circuit for controlling at least one of the driving circuit and the reading circuit, etc.

The scintillator 4 is firmly disposed on the first surface, opposite to the surface on which radiation is incident, of the photoelectric conversion unit 3. More specifically, the second surface of the scintillator 4 is firmly connected to the first surface of the photoelectric conversion unit 3 by evaporation or bonding.

In this configuration, when the scintillator 4 receives radiation passing through the substrate 2 and emits light in response thereto, the scintillator 4 absorbs a greater amount of radiation and emits a greater amount of light on its side closer to the photoelectric conversion unit 3 than on its opposite side. This results in an increase in the amount of visible light absorbable by the photoelectric conversion unit 3, which allows an increase in sensitivity. Furthermore, in the present configuration, the scintillator 4 emits light at a position close to the photoelectric conversion unit 3, and thus it is possible to reduce an influence of scatter of visible light, which results in an increase in MTF (Modulation Transfer Function).

The first surface of the scintillator 4 is fixed, via an adhesive, a mordant, a shock absorber, or the like, to the second surface of the support base 9 disposed in an enclosure case 8. The printed circuit boards 7a and 7b are disposed on the side of the first surface of a support base 9. An electrically conductive member 1 is placed in contact with the second surface of the substrate 2 or firmly connected to the second surface of the substrate 2 via an adhesive or the like. That is, the electrically conductive member 1 is in close contact with the second surface of the substrate 2. Thus, in the radiation detection apparatus configured in the above-described manner according to the present embodiment of the invention, the elements are located in the order the electrically conductive member 1, the photoelectric conversion unit 3, and the scintillator 4 from the radiation-incident side to the opposite side of the radiation detection apparatus.

On the radiation-incident side of the enclosure case 8, there is disposed a cover 5. The cover 5 is preferably capable of allowing radiation to easily pass therethrough and providing high water resistance and high airtightness such that an airtight housing is formed by the enclosure case 8 and the cover 5. In the housing formed by the enclosure case 8 and the cover 5, there are disposed the electrically conductive member 1, the substrate 2, the photoelectric conversion unit 3, the scintillator 4, the flexible wiring board 6, and the printed circuit boards 7a and 7b in such a manner that they are firmly attached to the support base 9. The printed circuit boards 7a and 7b are disposed on the side of the second surface of the support base 9. This reduces negative influence of the radiation on the integrated circuits.

When an image is captured, radiation has to pass through the radiation-transparent cover 5 to the electrically conductive member 1. Therefore, the electrically conductive member 1 is made of a conductive material with a proper thickness such that 99.0% or more of radiation is allowed to pass through the electrically conductive member 1. More specifically, for example, the electrically conductive member 1 may be produced by forming a thin metal film containing aluminum (hereinafter, referred to as an Al film) on the first surface of the substrate 2 by vacuum evaporation or bonding the Al film thereto using an adhesive. To achieve a necessary rigidity and radiation transmittance, the thickness of the Al film may be set to 0.1 to 100 μm. Another example of the electrically conductive member 1 is that obtained by firmly forming a thin metal film containing Fe such as a stainless steel film (hereinafter, referred to as a Fe film) on the first surface of the substrate 2. As with the Al film, the thickness of the Fe film is to be properly determined. For example, the thickness may be set to 0.1 to 10 μm. When a conductive material with high radiation absorption such as Pb is used as the electrically conductive member 1, the thickness is to be set 0.1 to 1 μm to achieve radiation transmittance equal to or greater than 99.0%.

The thin metal film generally has a high optical reflectance. Therefore, there is a possibility that light passing through the photoelectric conversion unit 3 is reflected back by the scintillator 4. To avoid this, the adhesive may contain a material with a high optical absorption. Another example of a conductive film formed by vacuum evaporation is a multilayer film including a Ti layer and an Al layer formed such that the Ti layer having high optical absorption is disposed on the second surface of the substrate 2 and the Al layer is disposed on the Ti layer. A still further example of a conductive film is a transparent conductive film such as an ITO (Indium Tin Oxide) film.

The electrically conductive member 1 is supplied with a fixed potential from a power supply circuit via the flexible wiring board 6 such that the electrically conductive member 1 functions as an electromagnetic shield. As for the fixed potential supplied thereto, various fixed potentials may be employed such as a ground potential, a potential supplied to the photoelectric conversion element, a potential supplied to the reading circuit, etc. To supply the ground potential as the fixed potential, the electrically conductive member 1 may be electrically connected to the enclosure case 8 or the support base 9 such that the electrically conductive member 1 is virtually supplied with the ground potential.

In the present embodiment, the electrically conductive member 1 is formed over the entire area of the second surface of the substrate 2. In this manner, the electrically conductive member 1 is in close contact with the second surface of the substrate 2 over its whole area.

In one embodiment, the area of the electrically conductive member 1 is larger than the area of the photoelectric conversion unit 3. The area where the electrically conductive member 1 is formed is not limited to that described above, but the electrically conductive member 1 may be formed on the second surface of the substrate 2 such that the electrically conductive member 1 extends over an area approximately equal to the area of the photoelectric conversion unit 3. It is not necessary to completely cover the whole second surface of the substrate 2. The electrically conductive member 1 may be formed in the shape of a mesh with a particular opening size as shown in FIG. 2A and FIG. 2B.

Figure 2A:
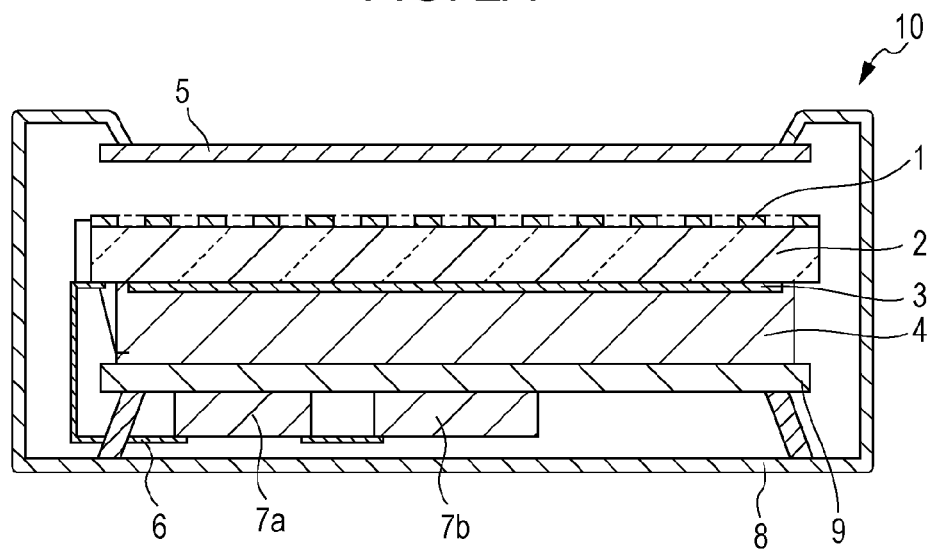
FIGS. 2A and 2B are a cross-sectional view and a back view of a radiation detection apparatus according to an embodiment of the present invention.
Figure 2B:
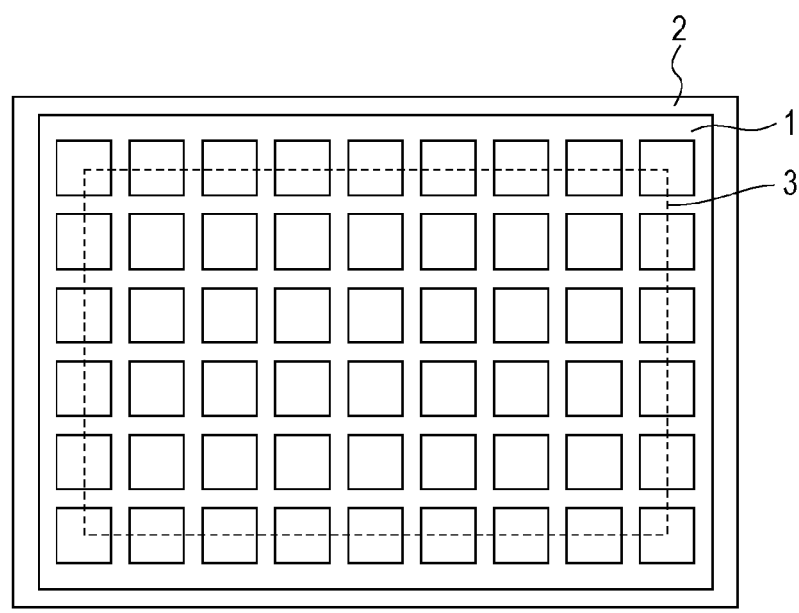

FIGS. 2A and 2B are respectively a cross-sectional view and a back view of the radiation detection apparatus in which the electrically conductive member 1 is formed in the shape of a mesh having square openings. In FIGS. 2A and 2B, the opening size may be properly determined depending on the frequency of electromagnetic noise to be blocked. For example, in a case where electromagnetic noise to be blocked has a frequency of 100 GHz, because the wavelength of the electromagnetic noise is about 3.0 mm, the opening size of the mesh (the area of each opening) of the electrically conductive member 1 may be set to 1.5 mm$^2$ to achieve a sufficiently high shielding capability. The X-ray radiation considered for imaging has a wavelength in the range of 1 pm ($1 \times 10^{-12}$ m) to 10 nm ($10 \times 10^{-9}$ m). Therefore, if the electrically conductive member 1 is formed in the above-described manner, the resultant electrically conductive member 1 can be low in absorption and reflection of radiation. Taking into account the MTF, the area size and the pitch of the openings of the mesh may be set to be equal to or an integer multiple of the area size and the pitch of the pixels.

A reflective layer (described in detail later) of the scintillator 4 may be supplied with the same fixed potential or the ground potential as that supplied to the electrically conductive member 1. This makes it possible to substantially completely cover the photoelectric conversion unit 3 disposed on the first surface of the substrate 2 by elements having the electromagnetic shielding capability. Thus, it is possible to reduce an influence of not only electromagnetic noise from the radiation source or other external apparatuses but also of electromagnetic noise that is generated in the radiation detection apparatus due to, for example, diffused reflection by integrated circuits or the electrically conductive member 1 and that reaches the radiation-incident surface of the substrate 2.

In this structure, the distance between the reflective layer and the electrically conductive member 1 may be properly determined depending on the frequency of electromagnetic noise to be blocked, in a similar manner to the mesh of the electrically conductive member 1. Because the electrically conductive member 1 is in close contact with the second surface of the substrate 2, the distance between the electrically conductive member 1 and the reflective layer of the scintillator 4 can be properly small. This makes is possible to achieve better electromagnetic shielding. Furthermore, the support base 9 may be supplied with the same fixed potential or the ground potential as that supplied to the electrically conductive member 1.

As for the substrate 2, many types of substrates may be used as long as they have an insulating surface. A specific example is an insulating substrate such as a glass substrate, a quartz substrate, a plastic substrate, etc., an insulating substrate with an insulating film disposed on its surface. Another example is an electrically conductive substrate with an insulating film disposed on its surface such as a single-crystal silicon substrate or a metal substrate with an insulating film disposed on its surface. As for the material of the substrate 2, a material may be employed that can be easily thinned via a thinning process.

Figure 3A:
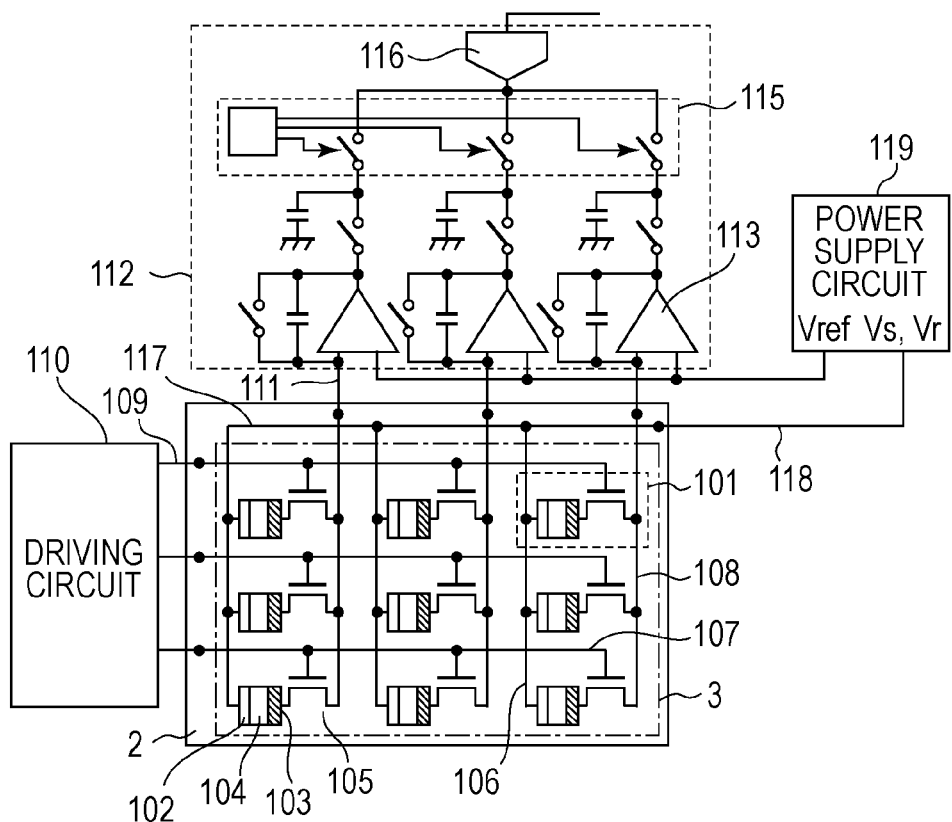
FIGS. 3A and 3B are an equivalent circuit diagram of a radiation detection apparatus and a cross-sectional view of one pixel thereof according to an embodiment of the present invention.

Next, referring to FIG. 3A, an equivalent circuit of the radiation detection apparatus according to the present embodiment of the invention is described below. In the radiation detection apparatus according to the present embodiment of the invention, the photoelectric conversion unit 3 including the plurality of pixels 101 arranged in the form of an array including rows and columns is disposed on the first surface of the substrate 2.

Each pixel 101 includes a photoelectric conversion element 104 that converts radiation or light into an electric charge, and a switch element 105 that outputs an electric signal corresponding to the electric charge generated by the photoelectric conversion element 104.

In the present embodiment, a metal-insulator-semiconductor type (MIS-type) photoelectric conversion element is used as each photoelectric conversion element, and a thin film transistor (TFT) is used as each switch element.

The scintillator 4 for converting radiation into visible light detectable by the photoelectric conversion element may be disposed on the radiation-incident side of the photoelectric conversion element. A first electrode 103 of each photoelectric conversion element 104 is electrically connected to a first main electrode of a corresponding one of the switch elements 105, and a second electrode 102 of the conversion element 104 is electrically connected to one of bias lines 106. Each bias line 106 is connected in common to second electrodes 102 of photoelectric conversion elements 104 arranged in a corresponding one of columns. A control electrode of each switch element 105 is electrically connected to one of driving lines 107, and a second main electrode of the switch element 105 is electrically connected to one of signal lines 108. Each driving line 107 is connected in common to control electrodes of switch elements 105 arranged in a corresponding one of rows and also electrically connected to a driving circuit 110 via a corresponding one of first interconnection wirings 109.

The driving circuit 110 is configured to sequentially or simultaneously supply driving pulses to a plurality of driving lines 107 arranged in the column direction whereby electric signals are output from pixels in units of rows in parallel to a plurality of signal lines 108 arranged in the row direction.

Each signal line 108 is electrically connected in common to the second main electrodes of a plurality of switch elements 105 arranged in the column direction, and is also electrically connected to a reading circuit 112 via a second connection line 111.

The reading circuit 112 includes integrating amplifiers 113 provided for the respective signal lines 108 and configured to provide an integrated and amplified value of the electric signals received via the signal lines 108, and sample-and-hold circuits configured to sample and hold the amplified electric signals provided by the integrating amplifier 113. The reading circuit 112 further includes a multiplexer 115 configured to convert the electric signals output in parallel from the sample-and-hold circuits into a series electric signal, and an analog-to-digital converter 116 configured to convert the output electric signal into digital data. A reference potential Vref is supplied from a power supply circuit 119 to a non-inverting input terminal of the reading circuit 112.

The power supply circuit 119 is also electrically connected to a plurality of bias lines 106 arranged in the row direction via a common bias line 117 and a third connection line 118 to supply a bias potential Vs or an initialization potential Vr to the second electrodes 102 of the respective conversion elements 104.

Next, an operation of the radiation detection apparatus according to the present embodiment is described below with reference to FIG. 3A. The reference potential Vref is applied to the first electrode 103 of the conversion element 104 via the switch element and the bias potential Vs is applied to the second electrode 102 thereby biasing the conversion element 104 such that a photoelectric conversion layer of the MIS-type photoelectric conversion element is depleted. In this state, the radiation emitted toward an object under examination passes through the object while attenuating in intensity, and is converted into visible light by a fluorescent member (not shown). The resultant visible light is incident on the photoelectric conversion element and is converted into an electric charge.

The electric signal corresponding to the electric charge is output over the signal line 108 when the switch element 105 turns on in response to the driving pulse applied from the driving circuit 110 to the driving line 107, and the electric signal is read out as digital data by the reading circuit 112. Thereafter, the potential of the bias line 106 is changed from the bias potential Vs to the initialization potential Vr to turn on the switch element 105 thereby removing positive or negative residual carriers from the photoelectric conversion element. Thereafter, the potential of the bias line 106 is changed from the initialization potential Vr to the bias potential Vs to complete the initialization of the conversion element 104.

Figure 3B:
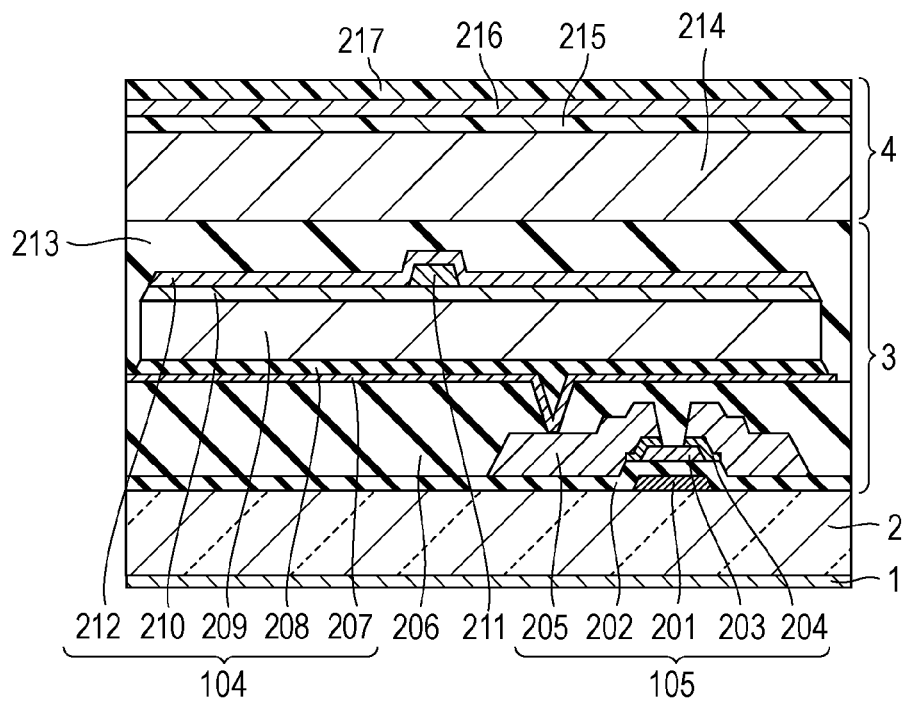

Next, referring to FIG. 3B, a cross-sectional structure of one pixel is described below. The TFT serving as the switch element 105 includes a first conductive layer 201, a first insulating layer 202, a first semiconductor layer 203, a first impurity semiconductor layer 204, and a second conductive layer 205, formed on the first surface of the substrate 2. The first conductive layer 201 is used as a control electrode (gate electrode) of the TFT, and the first insulating layer 202 is used as a gate insulating film of the TFT. The first semiconductor layer 203 serves as a channel, the first impurity semiconductor layer 204 serves as an ohmic contact layer, and the second conductive layer 205 serves as a first or second main electrode (source or drain electrode) of the TFT.

At an upper layer level, a second insulating layer 206 is disposed as an interlayer insulating layer. As for the second insulating layer, an organic insulating film, an inorganic insulating film, or a multilayer structure thereof may be used.

More specifically, a multilayer structure including an inorganic insulating film serving as a passivation film covering the TFT and an organic insulating film serving as a planarization film may be used.

On the second insulating layer 206, the photoelectric conversion element 104 is formed. The photoelectric conversion element 104 includes a third conductive layer 207, a third insulating layer 208, a second semiconductor layer 209, a second impurity semiconductor layer 210, and a fifth conductive layer 212. The third conductive layer 207 serves as a lower electrode (first electrode 103) of the photoelectric conversion element 104. The third insulating layer 208 serves as a perfect insulating layer for blocking generated positive and negative carriers from moving. The second semiconductor layer 209 serves as a photoelectric conversion layer that converts radiation or light into an electric charge.

The second impurity semiconductor layer 210 serves as a blocking layer that blocks positive or negative carriers from moving. The fifth conductive layer 212 serves as an upper electrode (second electrode 102). The fourth conductive layer 211 serves as the bias line 106.

The upper electrode (second electrode 102) serves to apply a bias voltage to the whole conversion elements 104, wherein the bias voltage is equal to the difference between the bias potential Vs or the initialization potential Vr supplied via the bias line 106 and a reference potential Vref supplied to the first electrode 103. As described above, the switch element 105 and the photoelectric conversion element 104 are disposed on the first surface of the substrate 2 in a stacked manner.

At a further upper layer level, a fourth insulating layer 213 serving as both a passivation film and a planarization layer as with the second insulating layer 206 is disposed. One pixel is formed by these elements described above. The photoelectric conversion unit 3 is formed in the multilayer structure including various conductive or insulating layers described above such as the first conductive layer and the fourth insulating layer 213.

The scintillator 4 is firmly disposed on the first surface of the photoelectric conversion unit 3. The scintillator 4 includes a fluorescent layer 214, a fluorescent layer protecting layer 215, a reflective layer 216, and a support element 217. The fluorescent layer 214 is for converting incident radiation into visible light with a wavelength in a range detectable by the photoelectric conversion element. The fluorescent layer 214 is formed on the first surface of the photoelectric conversion unit 3 by evaporation or the fluorescent layer 214 is firmly bonded to the first surface of the photoelectric conversion unit 3 via an adhesive.

The fluorescent layer protecting layer 215 is for protecting the fluorescent layer 214 from water or an impact. The fluorescent layer protecting layer 215 may be made of an organic resin. The reflective layer 216 is for reflecting visible light emitted by the fluorescent layer 214 in a direction toward the photoelectric conversion unit 3. The reflective layer 216 may be made of a metallic material such as aluminum highly transparent to radiation and highly reflective to light. The reflective layer 216 may be applied with a fixed potential such that it serves as an electromagnetic shield.

The support element 217 is for ensuring high rigidity of reflective layer 216 and protecting the fluorescent layer 214 and the reflective layer 216. The support element 217 may be an organic resin sheet such as a PET (polyethylene terephthalate) sheet. The reflective layer 216 is formed over the first surface of the substrate 2 such that at least the photoelectric conversion unit 3 is covered by the reflective layer 216. In this structure in which the reflective layer 216 is formed in the above-described manner, the distance between the reflective layer 216 and the electrically conductive member 1 located in close contact with the second surface of the substrate 2 is substantially given by the thickness of the substrate 2, which enhances electromagnetic shielding.

The scintillator 4 is fixed to the support base 9 such that the surface of the scintillator 4 on which the support element 217 is disposed is in contact with the support base 9. Next, specific examples of thicknesses of various elements are described below. As for the substrate 2, a glass substrate with a typical thickness of 0.7 mm may be used. The thickness of the switch element 105 may be about 0.5 µm, the thickness of the second insulating layer 206 may be about 3.5 µm, the thickness of the photoelectric conversion element 4 may be about 1 µm, and the thickness of the fourth insulating layer 213 may be about 5 µm. In this case, the photoelectric conversion unit 3 has a total thickness of about 10 µm. The thickness of the fluorescent layer 214 may be about 400 µm, the thickness of the fluorescent protection layer 215 may be about 50 µm, the thickness of the reflective layer 216 may be about 20 µm, and the thickness of the support element 217 may be about 10 µm. In this case, the scintillator 4 has a total thickness of about 500 µm. Thus, the distance between the electrically conductive member 1 and the reflective layer 216 in a peripheral area around the photoelectric conversion unit 3 is about 0.8 mm. To block the electromagnetic noise with a frequency of 100 GHz, the distance is to be less than 1.5 mm, and thus above value of the distance between electrically conductive member 1 and the reflective layer 216 is smaller than the critical value.

Thus, the photoelectric conversion unit 3 is substantially completely covered by the electromagnetic shield provided by the electrically conductive member 1 and the reflective layer 216, and thus good electromagnetic shielding is achieved.

In the case where the electrically conductive member 1 is disposed on the second surface of the substrate 2 via an adhesive, the total thickness including the thickness of the adhesive may be set to be smaller than the critical value. By disposing the electrically conductive member 1 in close contact with the second surface of the substrate 2 in the above-described manner, it is possible to suppress intrusion of electromagnetic noise originating from the radiation source or an external apparatus and reaching the radiation-incident surface of the substrate 2. It is also possible to suppress intrusion of electromagnetic noise generated inside the radiation detection apparatus and reaching the radiation-incident surface of the substrate 2.

Second Embodiment

A second embodiment of the present invention is described below with reference to FIGS. 4A and 4B. The following description will focus on differences from the first embodiment described above, and similar structures or elements to those according to the first embodiment will be omitted.

A first difference is in that the substrate 2 has an insulating surface produced by performing a thinning process on the second surface of the substrate 2 at least in the area where the photoelectric conversion unit 3 is disposed. By employing the substrate 2 formed in the above-described manner, it is possible to reduce the attenuation of the radiation by the substrate 2 in the area corresponding to the photoelectric conversion unit 3. The thinning process of the substrate 2 may be performed at least for the area where the photoelectric conversion unit 3 is formed, although the whole second surface of the substrate 2 may be subjected to the thinning process.

In the thinning process, when a glass substrate is used as the substrate 2, plasma dry etching or wet etching may be used. When such a substrate having a thinned insulating surface is employed as the substrate 2, a consideration may be necessary on capacitance formed between the electrically conductive member 1 and a conductive layer opposing the electrically conductive member 1 via the substrate 2. In particular, when the thickness of the thinned area is equal to or less than 0.1 mm, a consideration is necessary on the capacitance formed between the second conductive layer 205 and the first conductive layer 201 serving as the driving line 107 or the signal line 108.

Figure 4A:
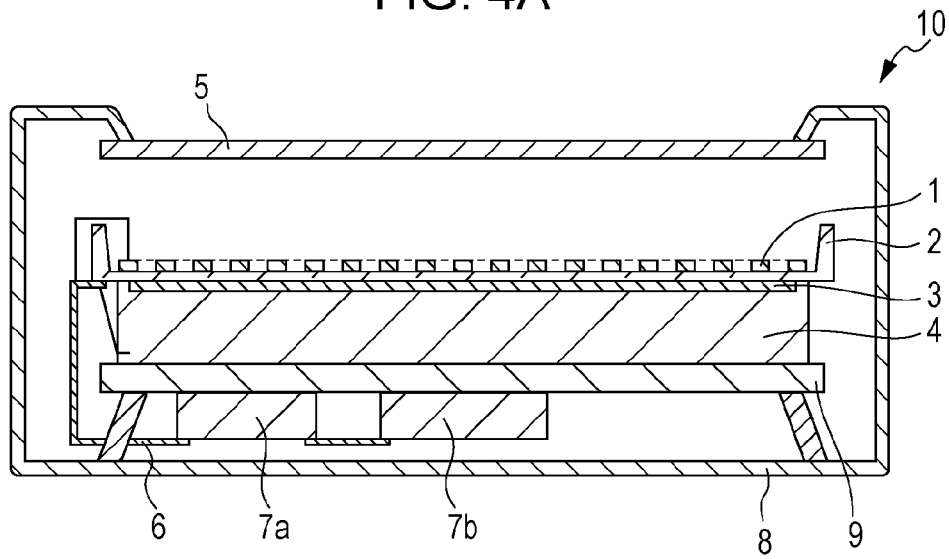
FIGS. 4A and 4B are a cross-sectional view and an enlarged back view of a radiation detection apparatus according to an embodiment of the present invention.
Figure 4B:
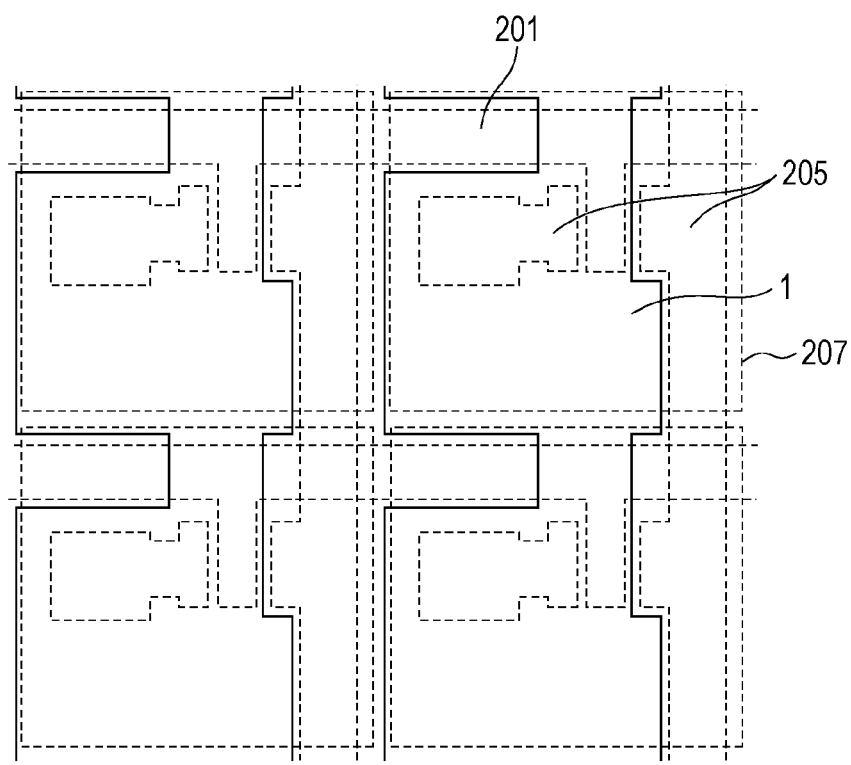

For example, the electrically conductive member 1 may be formed so as to have a pattern such as that shown in FIG. 4B to reduce the capacitance between the electrically conductive member 1 and the first conductive layer 201 serving as the driving line 107 or the second conductive layer 205 serving as the signal line 108. More specifically, for example, the electrically conductive member 1 may be patterned such that the electrically conductive member 1 does not have a part that opposes the second conductive layer 205 serving as the signal line 108 via the substrate 2, and/or the electrically conductive member 1 may be patterned so as to reduce the size of the part of the electrically conductive member 1 that opposes the first conductive layer serving as the driving line 107 via the substrate 2. The patterning described above is a second difference.

Figure 5A:
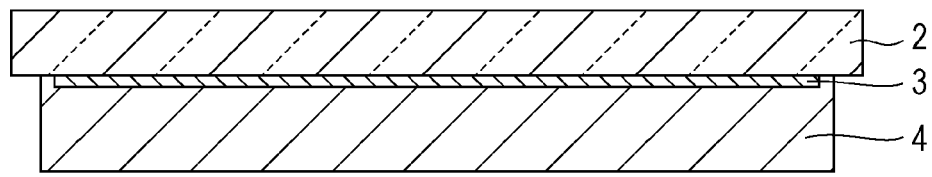
FIGS. 5A to 5C are cross-sectional views illustrating a production process of a radiation detection apparatus according to an embodiment of the present invention.

Next, referring to FIGS. 5A to 5C, a method of producing the radiation detection apparatus according to the present embodiment is described below. First, as shown in FIG. 5A, the photoelectric conversion unit 3 is formed on the first surface of the substrate 2 having the insulating surface using a known thin-film semiconductor production technology. Thereafter, the scintillator 4 is disposed on the first surface of the photoelectric conversion unit 3 using a known method.

Figure 5B:
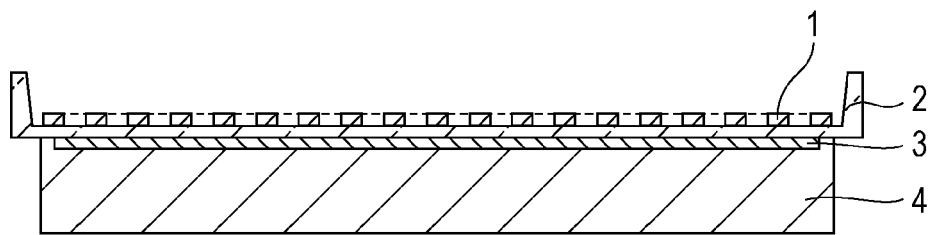

Furthermore, predetermined regions of the second surface side of the substrate 2 are thinned using a known thinning process such that the substrate 2 has a shape in cross section as shown in FIG. 5B. Thereafter, a film of a conductive material to be used as the electrically conductive member 1 is formed on the processed second surface of the substrate 2 in a similar manner to the first embodiment, and the conductive material is patterned into a pattern as shown in FIG. 4B using a known thin-film semiconductor production technology thereby obtaining the electrically conductive member 1.

Figure 5C:
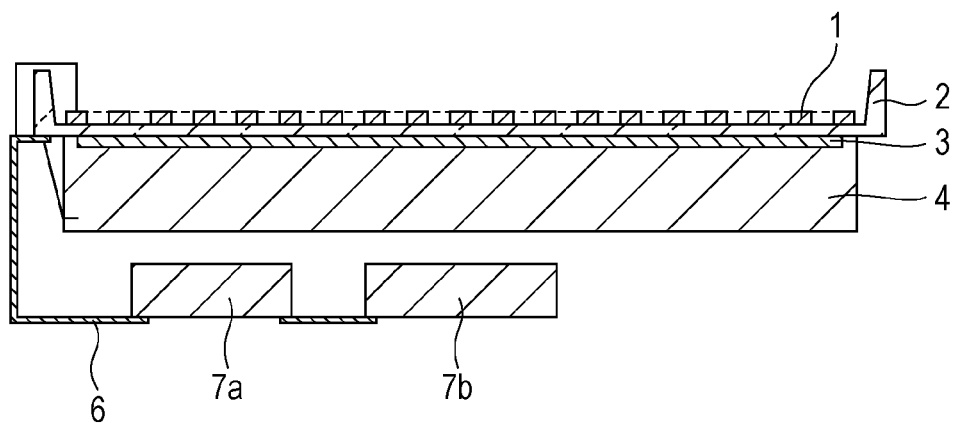

Next, as shown in FIG. 5C, the printed circuit boards 7a and 7b are connected to the peripheral region of the substrate 2 via the flexible wiring board 6. In the present embodiment, the peripheral region of the substrate 2 is not thinned such that the peripheral regions has a sufficiently large thickness to ensure high strength to allow the connection to be performed.

Because the connection is performed after the scintillator 4 is disposed in the above-described manner, the rigidity of the substrate 2 is reinforced by the scintillator 4, and thus the rigidity is high enough to allow the connection to be performed.

Thereafter, the enclosure case 8 in which the support base 9 is disposed is provided, and a set of the substrate 2, the photoelectric conversion unit 3, the scintillator 4, the flexible wiring board 6, and the printed circuit boards 7a and 7b is placed in the enclosure case 8 such that the first surface of the scintillator 4 is fixed to the support base 9 and such that the printed circuit boards 7a and 7b are located on the side of the first surface of the support base 9.

Thereafter, the cover 5 is disposed on the radiation-incident side of the enclosure case 8 such that the radiation detection apparatus shown in FIG. 4A is obtained.

Note that the production process described above with reference to FIGS. 5A to 5C is not limited to the present embodiment, but it may also be applied to the first embodiment.

By employing the above-described structure according to the present embodiment, not only the advantages similar to those achieved in the first embodiment are achieved, but it is also possible to suppress the attenuation of the radiation incident on the substrate 2 in the region corresponding to the photoelectric conversion unit 3 due to the absorption by the substrate 2 without leading to an increase in noise of a signal read via the signal line 108. Thus, the radiation detection apparatus according to the present embodiment can have a higher sensitivity than can be achieved according to the first embodiment.

Third Embodiment

Figure 6:
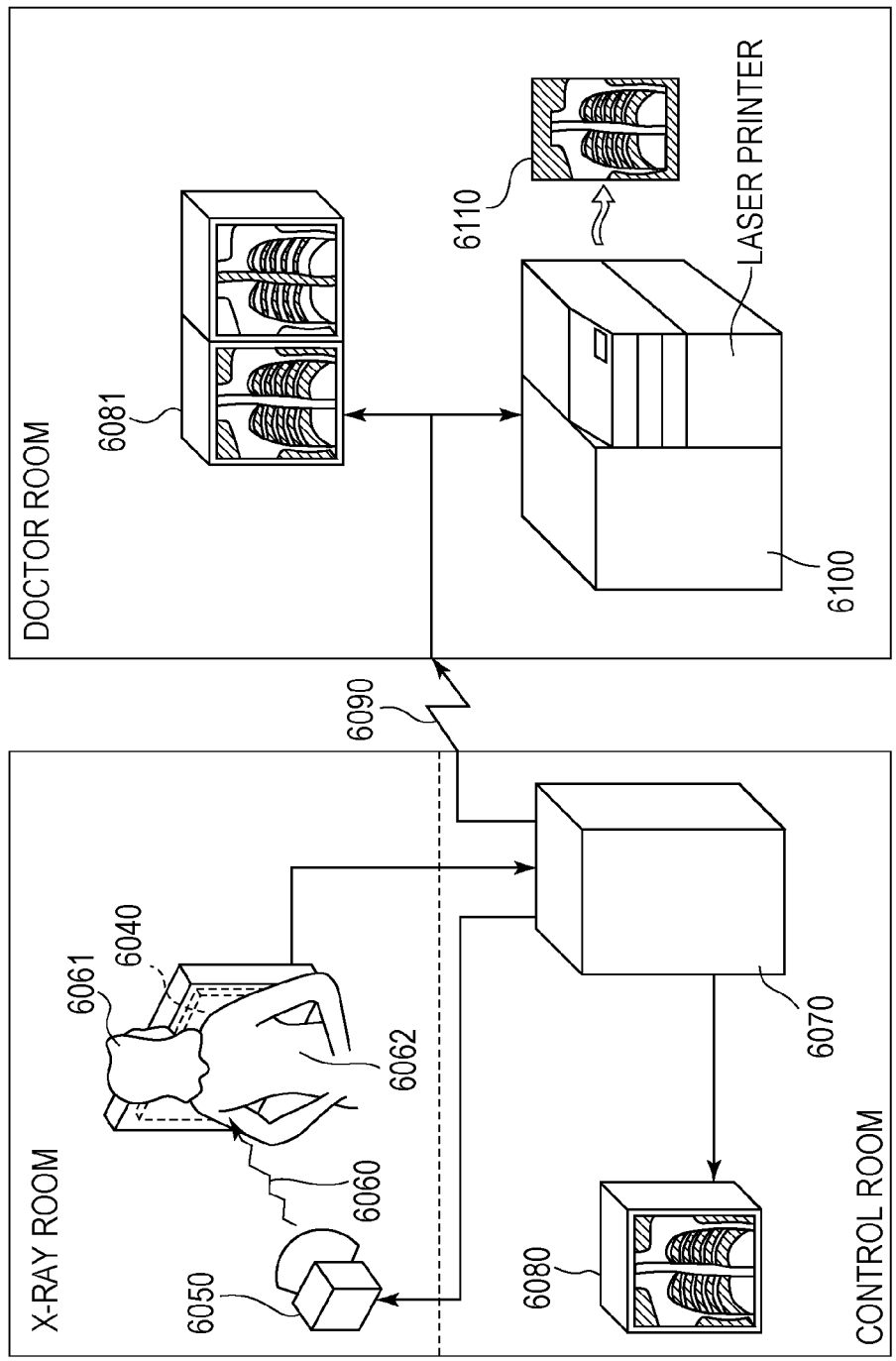
FIG. 6 is a diagram illustrating a radiation detection system using a radiation detection apparatus according to an embodiment of the present invention.

Referring to FIG. 6, a radiation detection system using a radiation detection apparatus according to an embodiment of the present invention is described below. An X-ray 6060 generated by an X-ray tube 6050 serving as a radiation source passes through a body part (chest) 6062 of a patient or a subject 6061 under examination and is incident on a radiation detection apparatus 6040 having a scintillator 4 disposed on a first surface of the photoelectric conversion unit 3. The incident X-ray includes information on the inside of the body of the patient 6061. In response to the incident X-ray, the scintillator 4 emits light. The emitted light is converted into electric charge by the photoelectric conversion unit 3. The electric charge is converted into a digital signal and is subjected to image processing by an image processor 6070 serving as a signal processing unit. A resultant image (obtained information) is displayed on a display 6080 serving as a display unit installed in a control room. The obtained information may be transferred to a remote location by a transmitting unit via a telephone line 6090 or the like. The information may be displayed on a display 6081 serving as a display unit installed in a doctor room at the remote location or it may be stored in a storage medium such as an optical disk. This allows a doctor at the remote location to make a diagnosis. The information may be recorded on a film 6110 serving as a recording medium by a film processor 6100 serving as a recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-260524 filed Nov. 22, 2010, which is hereby incorporated by reference herein in its entirety.

What is claimed is:

1. A radiation detection apparatus comprising:
   a scintillator configured to convert incident radiation into visible light;
   a photoelectric conversion unit including a two-dimensional array of pixels arranged on a substrate, each pixel configured to convert the visible light into an electric signal; and
   an electrically conductive member supplied with a fixed potential;
   wherein the electrically conductive member, the substrate, the photoelectric conversion unit, and the scintillator are disposed in this order from a radiation-incident side of the radiation detection apparatus to an opposite side thereof.

2. The radiation detection apparatus according to claim 1, wherein the photoelectric conversion unit is disposed on a surface of the substrate opposite to a surface on which the radiation is incident, and the electrically conductive member is disposed on the radiation-incident surface of the substrate.

3. The radiation detection apparatus according to claim 2, wherein the electrically conductive member is disposed such that the electrically conductive member is at least partially in contact with the radiation-incident surface of the substrate or such that the electrically conductive member is bonded to the radiation-incident surface of the substrate.

4. The radiation detection apparatus according to claim 3, wherein the scintillator includes a fluorescent layer that converts radiation into light detectable by the pixels and a reflective layer for reflecting the light emitted by the fluorescent layer, and the reflective layer is supplied with a fixed potential.

5. The radiation detection apparatus according to claim 4, wherein the reflective layer is supplied with the fixed potential that is the same as that supplied to the electrically conductive member.

6. The radiation detection apparatus according to claim 1, further comprising a housing in which at least the substrate, the scintillator, and the electrically conductive member are disposed, wherein the housing includes the enclosure case including a support base and a cover disposed on a radiation-incident side of the enclosure case, and wherein a surface, opposite to a radiation-incident surface, of the scintillator is fixed to the support base.

7. The radiation detection apparatus according to claim 6, further comprising a printed circuit board connected to a peripheral regions of the substrate via a flexible wiring board, wherein the flexible wiring board is disposed on a side, opposite to a radiation-incident side, of the support base, and wherein a power supply circuit is disposed on the flexible wiring board, and the fixed potential is supplied from the power supply circuit via the flexible wiring board.

8. The radiation detection apparatus according to claim 6, wherein the electrically conductive member is electrically connected to the enclosure case or the support base.

9. The radiation detection apparatus according to claim 1, wherein the substrate has an insulating surface formed by performing a thinning process on the substrate 2 from a radiation-incident side thereof at least in an area where the photoelectric conversion unit is disposed.

10. The radiation detection apparatus according to claim 9, wherein each of the pixels includes a photoelectric conversion element and a switch element, wherein the radiation detection apparatus further comprises a driving line and a signal line disposed on a surface, opposite to the radiation-incident surface, of the substrate, the driving line connected to a plurality of switch elements arranged in a row direction, the signal line connected to a plurality of switch elements arranged in a column direction, the electrically conductive member is disposed on the surface, on the radiation-induced side, of the substrate in areas including at least in an area where the photoelectric conversion unit is disposed such that no electrically conductive member is disposed in an area opposing the signal line and such that an area where the electrically conductive member opposes the driving line has a smaller width than the other areas.

11. A radiation detection system comprising:

the radiation detection apparatus according to claim 1;

a signal processing unit configured to process a signal from the radiation detection apparatus;

a storage unit configured to store a signal supplied from the signal processing unit;

a display unit configured to display the signal supplied from the signal processing unit; and a transmitting unit configured to transmit the signal supplied from the signal processing unit.

* * * * *